310-335 SR
5/17/83 XR 4,384,228

United States Patent [19] [11] 4,384,228
Dias [45] May 17, 1983

[54] ACOUSTO-ELECTRIC TRANSDUCER

[75] Inventor: J. Fleming Dias, Palo Alto, Calif.

[73] Assignee: Hewlett-Packard Company, Palo Alto, Calif.

[21] Appl. No.: 217,633

[22] Filed: Dec. 18, 1980

[51] Int. Cl.³ ............................................. H01L 41/04

[52] U.S. Cl. ................................ 310/313 D; 310/335; 333/195

[58] Field of Search ............... 310/313 R, 313 D, 326, 310/327, 334-337; 333/193-195; 73/632, 642, 644; 128/660

[56] References Cited

U.S. PATENT DOCUMENTS 3,596,211 7/1971 Dias et al. ........................... 333/194
3,662,293 5/1972 De Vries ........................ 310/313 D
3,859,608 1/1975 Hartmann et al. ............. 310/313 D
4,277,712 7/1981 Hanafy ................................ 310/334

*Primary Examiner*—William M. Shoop
*Assistant Examiner*—Peter S. Wong
*Attorney, Agent, or Firm*—Donald N. Timbie

[57] ABSTRACT

An array of transducers is mounted on a base and means are provided for causing surface waves that emanate in opposite directions along the base to be reflected by transducers on either side so as to follow paths of respectively different lengths in going to the adjacent transducers and back to the transducer from which they emanated, the difference in path lengths being such that the surface waves return to the transducer from which they emanated out of phase with each other. The means can be comprised of grooves or spaces between pairs of transducers.

6 Claims, 6 Drawing Figures

ACOUSTO-ELECTRIC TRANSDUCER

BACKGROUND OF THE INVENTION

This invention relates to improvements in acoustoelectric transducers in the form of an array of piezoelectric crystals mounted in parallel on an energy absorbing base. A prior art transducer of this type is schematically illustrated in FIG. 1 wherein crystals $T_3$, $T_4$ and $T_5$ are shown mounted on a base 8. Transducers of this type are used in ultrasonic imaging apparatus to transmit pulses of a few cycles of acoustic waves into the body under examination and to convert acoustic energy reflected back to them by internal structures in the body into corresponding electrical signals. The signals are summed and applied to control the intensity of the image. Although the means for exciting the crystals so that they will transmit the pulses of acoustic waves are not shown in FIG. 1, they function by applying a few cycles of an alternating voltage across the thickness of the crystal, i.e., between the base and the opposite side, the cycle having a frequency equal to the frequency at which the crystal resonates in thickness. The pulses are made as short as possible in order to optimize the range resolution.

It has been found, however, that excitation of a crystal in a thickness mode causes surface waves having a frequency less than the resonant frequency of the thickness mode to emanate in opposite directions along the top of the base 8 as indicated by the arrows 10 and 12, emanating from the crystal $T_4$ (see Page 8 and FIG. 4*d* of "Rayleigh and Lamb Waves" by I. A. Viktorow, Plenum Press 1967). When the surface waves reach the crystals $T_3$ and $T_5$ respectively, they are reflected with a change in phase depending on the impedance of the crystals back toward the crystal $T_4$ as indicated by the arrows 10' and 12'. Because the total distance of the paths along the arrows 10 and 10' is the same as the total distance along the paths 12 and 12', the phase shift caused by the distance traversed is the same so that the reflected waves return to the crystal $T_4$ with identical phases and create a resonant condition which induces crystal $T_4$ to manifest the lower frequency resonant mode. The mode conversion from the surface to bulk mode by the induced resonance effectively prolongs the fundamental thickness mode of the crystal $T_4$ so that the transmitted acoustic pulses are broadened, thereby reducing the range resolution that might otherwise be obtained. Inherent in the conversion from surface to bulk modes is an element of delay caused by the transit time so that the excitation of the crystal $T_4$ responds to the main excitation and to delayed additions that tend to broaden the pulse.

BRIEF DESCRIPTION OF THE INVENTION

In accordance with this invention, the deleterious effect of the surface waves just described is largely overcome by constructing the array of crystals in such manner that the length of the path of the surface wave from any given crystal to and from the adjacent crystal on one side, such as along the arrows 10, 10', differs from the length of the path of the surface wave from the given crystal to and from the adjacent crystal on the other side, such as along the arrows 12, 12'. Assuming that these adjacent crystals have the same reflection coefficient, the difference in the lengths of the paths is made such that the reflected waves return to the given crystal out of phase with each other and cancel one another.

In accordance with one embodiment of the invention, the required differences in the lengths of paths is attained by cutting grooves of such depth in the base between adjacent pairs of crystals that the path lengths differ by a whole number of quarter-wavelengths of the surface wave in the base.

In accordance with another embodiment of the invention, the required difference in the lengths of the paths is attained by spacing the pairs of crystals farther apart than the crystals of each pair.

DETAILED DESCRIPTION OF THE INVENTION

Figure 1:
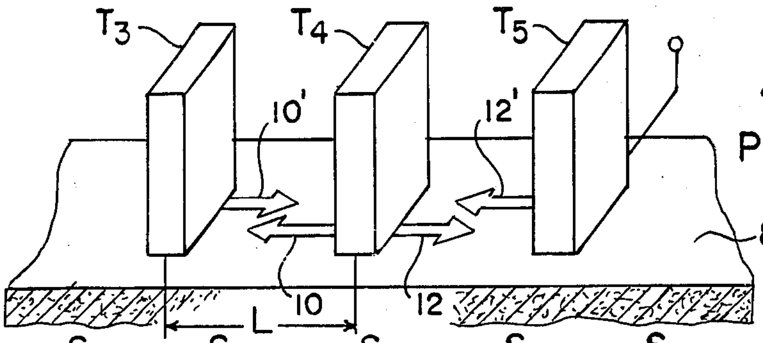
FIG. 1 PRIOR ART
FIG. 1 is a three-dimensional view of an array of transducers constructed in accordance with the prior art.
Figure 2:
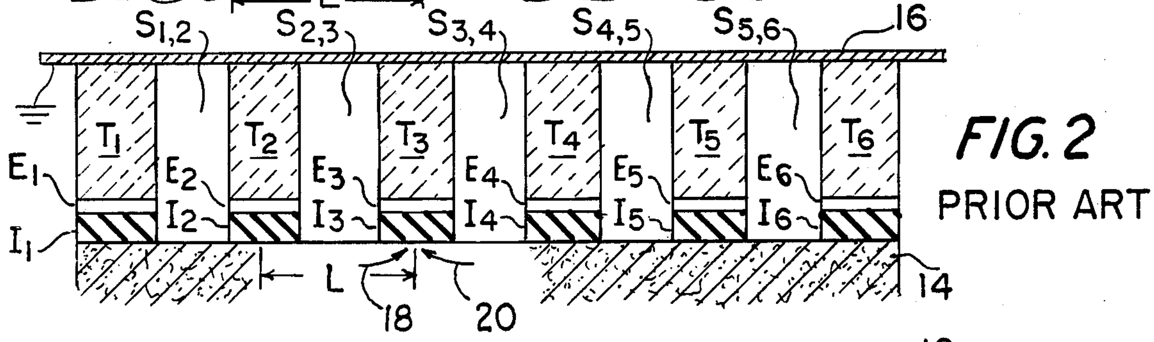
FIG. 2 PRIOR ART
FIG. 2 is a cross-section of an array of transducers constructed in accordance with the prior art.

A more detailed illustration of the prior art array of transducers including the transducers $T_3$, $T_4$ and $T_5$ of FIG. 1 is shown in the cross-section of FIG. 2 in which a base 14 has a plurality of crystals $T_1$ through $T_6$ mounted thereon. A grounded shield 16 is mounted across the tops of the crystals so as to make electrical contact therewith. Excitation of the crystals so as to cause them to vibrate in a plane perpendicular to the base 14, i.e., in the thickness mode, is achieved by respectively applying a few cycles of the resonant frequency f of the thickness mode of the crystals to electrodes $E_1$ through $E_6$ at appropriate times. Because the base 14 is often made of conductive material, layers of insulation $I_1$ through $I_6$ are respectively adhered between the electrodes $E_1$ through $E_6$ and the base 14. When $T_1$ through $T_6$ are excited, what is known as a "hammer effect" causes acoustic waves, herein referred to as surface waves, of some characteristic frequency to emanate in opposite direction from each crystal along the upper portion of the base 14, e.g., as indicated by the arrows 18 and 20 associated with the crystal $T_3$ and cause the broadening of the pulse as previously described.

If the distance between centers of the crystals $T_1$ through $T_6$ is L, the phase shift caused in the wave reflected back to $T_3$ from the adjacent crystals $T_2$ and $T_4$ by the distance travelled is $2\pi f(2L/V)$ radians where V is the velocity of sound along the top portion of the base 14. And because each crystal acts like a resonant circuit, it will cause an additional phase shift in the reflected waves that is a function frequency.

The separate crystals of the array are generally formed by adhering a large crystal to a sheet of metal which is to form the electrodes $E_1$ through $E_6$ and adhering a layer of insulation that is to form the insulators $I_1$ through $I_6$ between the sheet of metal and the base 14. Saw cuts $S_{1,2}$; $S_{2,3}$; $S_{3,4}$; $S_{4,5}$ and $S_{5,6}$ are made through the crystal, the metal sheet and just through the layer of insulation so as to form the structure of the prior art shown in FIG. 2.

Figure 3:
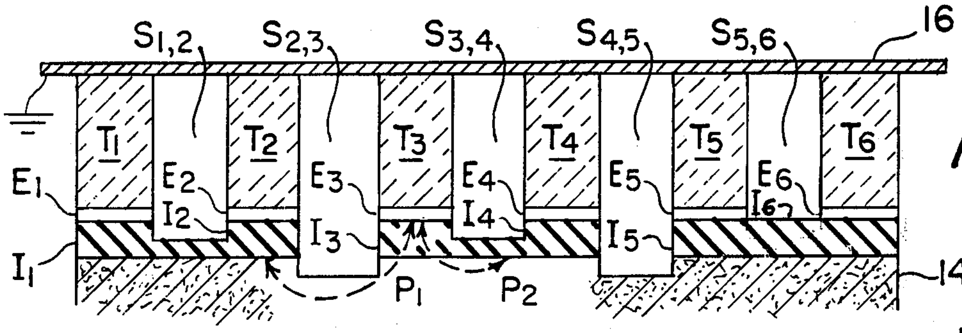
FIG. 3 is a cross-section of an array of transducers utilizing grooves in the base between pairs of transducers to secure the desired out-of-phase relationship between reflected waves in accordance with the invention.

In accordance with one embodiment of this invention, the saw cuts forming the grooves $S_{2,3}$ and $S_{4,5}$ that are respectively between the crystals $T_2$ and $T_3$ and between the crystals $T_4$ and $T_5$ extend into the base 14 as illustrated in FIG. 3. Components corresponding to FIG. 2 are indicated by the same designations. The saw cuts may extend partway through the insulation, as illustrated by the cut $S_{1,2}$ between the crystals $T_1$ and $T_2$, but it is possible for a saw cut to extend just through the metal layer as illustrated by the saw cut $S_{5,6}$ between the crystals $T_5$ and $T_6$. Thus, the array is comprised of pairs of crystals $(T_1,T_2)$, $(T_3,T_4)$ and $(T_5,T_6)$ having grooves between the pairs that extend into the base 14. Consider the crystal $T_3$. If the groove $S_{2,3}$ has the correct depth, a wave following path $P_1$ so as to be reflected by the crystal $T_2$ will arrive back at the crystal $T_3$ out of phase with a wave following path $P_2$ so as to be reflected by the crystal $T_4$ back to $T_3$. Examination will show that this same result is attained by all except the end crystals $T_1$ and $T_6$. The depths of the grooves between the crystals of the pairs can be different provided the differential paths result in the reflections to each crystal that are substantially out of phase. Although only six crystals are shown in the interest of simplifying the drawings, many more crystals would be used in a practical transducer.

Figure 4:
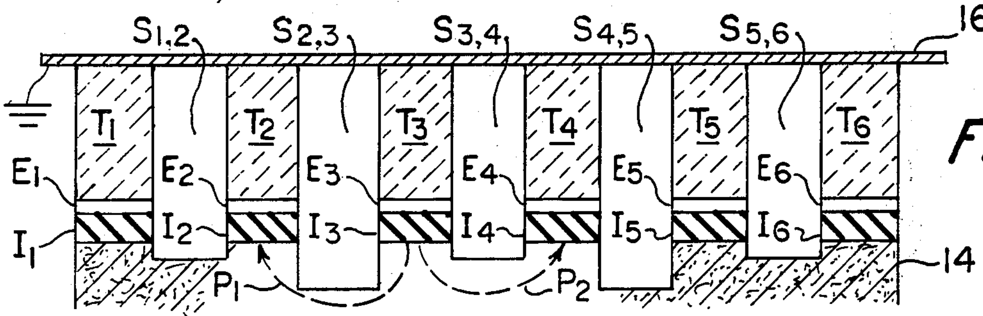
FIG. 4 is a cross-section of an array of transducers having grooves extending into the base between all transducers to secure the desired out-of-phase relationship between reflected waves in accordance with the invention.

FIG. 4 illustrates an alternative structure in which components corresponding to FIG. 3 have the same designations. All grooves extend into the base 14; the cuts between pairs of crystals have a depth in relation to the depth of the cuts between crystals of each pair so as to provide the different path lengths required.

Figure 5:
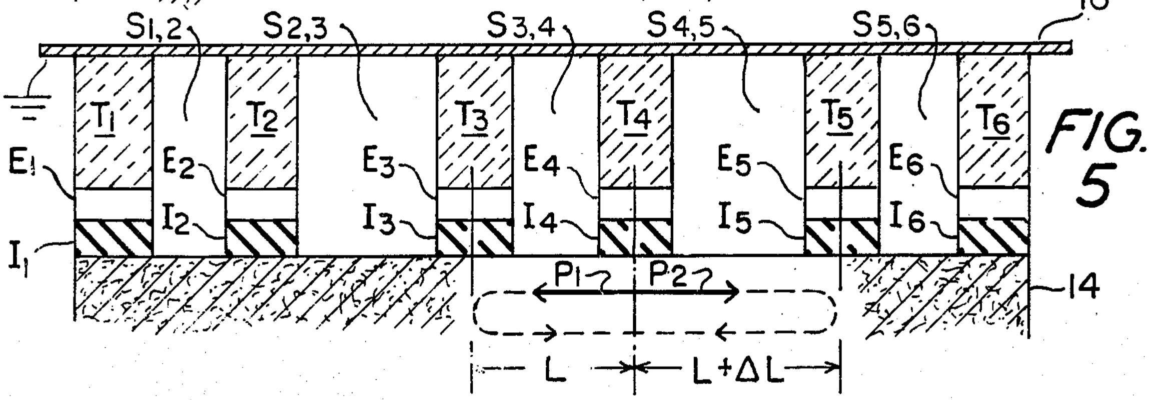
FIG. 5 is a cross-section of an array of transducers in which spaces between alternate transducers are different so as to attain the desired out-of-phase relationship between reflected waves in accordance with the invention.

Reference is now made to FIG. 5 in which components corresponding in function to FIG. 2 are designated in the same manner. In this embodiment of the invention, the pairs of crystals $(T_1,T_2)$, $(T_3,T_4)$ and $(T_5,T_6)$ are spaced farther apart than the crystals of each pair, e.g., crystals $T_3$ and $T_4$ are spaced apart by a distance L, and the crystal $T_4$ is spaced from the crystal $T_5$ by $L+\Delta L$. An acoustic wave emanating to the left from the crystal $T_4$ along a path $P_1$ will be reflected from the crystal $T_3$ and return to the crystal $T_4$ with a phase $4\pi f(L/V)$ where V is the velocity of propagation along the surface of the base 14. An acoustic wave emanating to the right from the crystal $T_4$ along a path $P_2$ will be reflected from the crystal $T_5$ and return to the crystal $T_4$ with a phase $4\pi f(L+\Delta L)/V$. Thus, if $\Delta L$ is equal to an odd multiple of $V/4f$, the reflected waves will arrive at the crystal $T_4$ out of phase with each other.

Figure 6:
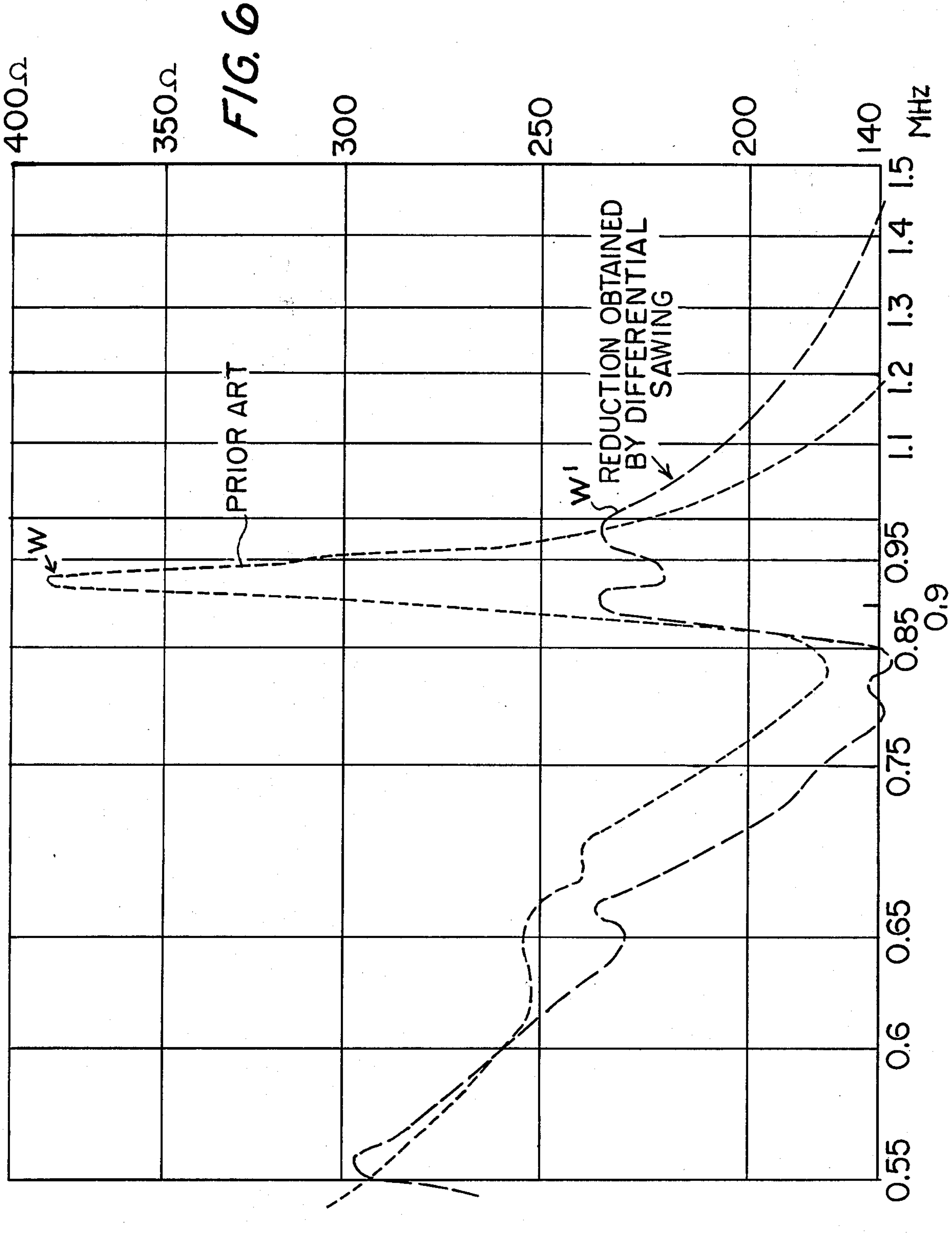
FIG. 6 is a graph illustrating the effects of surface waves in a prior art transducer array as well as in an array of this invention.

A way will now be described of determining the frequency of the surface wave. Once this is determined, the length of the surface wave in the base can be calculated by knowing the speed of sound in the base. First of all, make a prior art transducer array having five or more transducers. Then measure and plot the input impedance of the center transducer as a function of frequency. It will exhibit two major peaks, one broad band peak at the resonance frequency of the thickness mode and one high Q peak at the frequency caused by the surface wave travelling on the surface of the base 14, which in most cases will be lower. FIG. 6 illustrates a plot of an undesired high Q peak W caused by coherent reflections from adjacent transducers in a particular design like the prior art of FIG. 2. The curve W' illustrates the reduction in the undesired resonance attained by utilizing this invention.

What is claimed is:

1. An array of acousto-electric transducers, comprising
- a base,
- an array of planar transducers mounted on said base in spaced parallel relationship, said transducers vibrating at a given resonant frequency in a plane perpendicular to said base when excited, and
- means for causing surface waves that emanate in opposite directions along said base to be reflected by transducers on either side so as to follow paths of respectively different lengths in going to the adjacent transducers and back to the transducer from which they emanated, the difference in path lengths being such that the surface waves return to the transducer from which they emanated out of phase with each other.

2. An array as set forth in claim 1 wherein said last means is comprised of grooves between each pair of transducers and grooves between transducers of each pair, at least one of which extends into the base.

3. An array as set forth in claim 1 wherein said last means is comprised of grooves between pairs of transducers and grooves between the transducers of each pair that extend into the base.

4. An array as set forth in claim 1 wherein said last means is comprised of means mounting pairs of transducers on said base at a greater distance from each other than the transducers of each pair.

5. An acousto-electric transducer array, comprising
- a base of material for absorbing acoustic energy,
- a plurality of planar transducers mounted on said base in spaced parallel relationship, and
- means defining grooves in said base between adjacent pairs of transducers and grooves in said base between transducers of each pair such that surface waves emanating along said base from each transducer and reflected by adjacent transducers return to each transducer substantially out of phase.

6. An acousto-electric transducer array, comprising
- a base of material for absorbing acoustic energy,
- a plurality of planar transducers mounted on said base in spaced parallel relationship, and
- each pair of transducers being mounted at a distance along the base from the pairs of transducers on either side that is greater than the distance between the transducers of the pair.

* * * * *